(12) United States Patent
Kim et al.

(10) Patent No.: US 11,828,792 B2
(45) Date of Patent: Nov. 28, 2023

(54) TEST APPARATUS FOR SEMICONDUCTOR CHIPS WITH FINE-PITCH BUMPS

(71) Applicant: AMT CO., LTD., Asan-si (KR)

(72) Inventors: Du Chul Kim, Cheonan-si (KR); Wan Gu Lee, Cheonan-si (KR)

(73) Assignee: AMT CO., LTD., Asan-si (KR)

( * ) Notice: Subject to any disclaimer, the term of this patent is extended or adjusted under 35 U.S.C. 154(b) by 8 days.

(21) Appl. No.: 17/764,012

(22) PCT Filed: Sep. 8, 2020

(86) PCT No.: PCT/KR2020/012114
§ 371 (c)(1),
(2) Date: Mar. 25, 2022

(87) PCT Pub. No.: WO2021/107351
PCT Pub. Date: Jun. 3, 2021

(65) Prior Publication Data
US 2023/0030072 A1 Feb. 2, 2023

(30) Foreign Application Priority Data
Nov. 29, 2019 (KR) .......................... 10-2019-0156584

(51) Int. Cl.
*G01R 31/28* (2006.01)

(52) U.S. Cl.
CPC ................................ *G01R 31/2865* (2013.01)

(58) Field of Classification Search
CPC .............. G01R 1/0433; G01R 31/2865; G01R 31/2891; G01R 1/0458; G01R 1/0483;
(Continued)

(56) References Cited

U.S. PATENT DOCUMENTS

| 4,907,931 A | * | 3/1990 | Mallory | ............ H01L 21/67766 414/757 |
| 6,104,183 A | * | 8/2000 | Kobayashi | ......... G01R 31/2868 324/757.04 |

(Continued)

FOREIGN PATENT DOCUMENTS

| JP | 4808135 B2 | 11/2011 |
| JP | 5511790 B2 | 6/2014 |

(Continued)

OTHER PUBLICATIONS

International Search Report for PCT/KR2020/012114 dated Dec. 21, 2020 from Korean Intellectual Property Office.

*Primary Examiner* — Vinh P Nguyen
(74) *Attorney, Agent, or Firm* — Paratus Law Group, PLLC

(57) ABSTRACT

A test apparatus for devices having fine pitches, includes a loading picker provided on one side of a loading part so as to sequentially adsorb devices to be tested, thereby putting the adsorbed devices on the upper surface of a vacuum chuck, a device alignment part, which is provided at an upper portion of a loading zone for aligning the devices, tester for testing a performance of the devices for a set time as the vacuum chuck positioned in the test position moves and comes into electrical contact with bumps of respective devices, and an unloading picker, which is provided at one side of an unloading zone so as to adsorb tested devices from the vacuum chuck, sorts the tested devices into good products and bad products, and unloads the tested devices as sorted on a tray of an unloading part.

9 Claims, 13 Drawing Sheets

(58) Field of Classification Search
CPC .............. G01R 31/287; G01R 31/2874; G01R 31/2893
See application file for complete search history.

(56) References Cited

U.S. PATENT DOCUMENTS

| | | | | |
|---|---|---|---|---|
| 6,164,894 | A * | 12/2000 | Cheng ................ | G01R 31/2887 414/416.03 |
| 6,431,814 | B1 * | 8/2002 | Christensen ...... | H01L 21/67271 702/81 |
| 7,859,286 | B2 * | 12/2010 | Suzuki .................. | G01R 31/01 324/762.01 |
| 8,941,729 | B2 * | 1/2015 | Kikuchi ............. | G01R 31/2893 348/126 |
| 9,862,554 | B2 * | 1/2018 | Caveney ........... | H01L 21/67184 |

FOREIGN PATENT DOCUMENTS

| | | |
|---|---|---|
| KR | 10-1149759 B1 | 6/2012 |
| KR | 10-1464990 B1 | 11/2014 |
| KR | 10-1697119 B1 | 1/2017 |
| KR | 10-2019-0095035 A | 8/2019 |
| KR | 10-2040594 B1 | 11/2019 |

* cited by examiner

TEST APPARATUS FOR SEMICONDUCTOR CHIPS WITH FINE-PITCH BUMPS

CROSS REFERENCE TO PRIOR APPLICATIONS

This application is a National Stage Patent Application of PCT International Patent Application No. PCT/KR2020/012114 (filed on Sep. 8, 2020) under 35 U.S.C. § 371, which claims priority to Korean Patent Application No. 10-2019-0156584 (filed on Nov. 29, 2019), which are all hereby incorporated by reference in their entirety.

BACKGROUND

The present invention relates to a test apparatus for a device singulated by stacking a plurality of semiconductor chips and, more specifically, to a test apparatus for devices having fine pitches, which can execute a performance test by producing and then accurately aligning devices such as high bandwidth memories HBMs having small bumps, having a narrow pitch, and including many signal buses.

In recent years, there is a trend in the electronics industry to manufacture lightweight, miniaturized, high-speed, multi-functional, and high-performance products at low prices. In addition, in order to improve the performance of an integrated circuit, a three-dimensional structure such as a multi-chip stacked package is under development.

In such a multi-chip stacked package, an HBM is a high-performance (RAM) interface for a three-dimensional stacked dynamic RAM (DRAM).

The HBMs are separated into individuals through a sawing process after sequentially stacking multi-chips on a wafer and then integrally molding them.

FIG. 1 is a bottom view showing bumps of a general HBM, wherein the HBM 10 has numerous bumps 11 in a very narrow pitch p of about 125 to 170 μm, but there is a problem that the distance s from the edge of the HBM 10 to the center of the bumps disposed on the edge is not uniform as the HBM is cut and separated in a sawing process.

Therefore, in the state where the production of the HBMs having such a structure is completed, bumps with a small size (outer diameter) and a narrow pitch cannot be accurately aligned with the terminals of a tester, so the test cannot be carried out and the HBMs are shipped without test.

Accordingly, when a graphical processing unit GPU is configured by mounting defective parts of the HBM, there is a large problem that the entire GPU is defective.

PRIOR ART DOCUMENTS

[Patent Document 0001] Korean Reg. Patent Publication No. 10-1149759 (Reg. on May 18, 2012)
[Patent Document 0002] Korean Reg. Patent Publication No. 10-1464990 (Reg. on Nov. 19, 2014)

SUMMARY

The present invention has been derived to solve such problems in the prior art and has an objective to produce devices with bumps of a small size (outer diameter) and a narrow pitch, such as HBMs, and then precisely align the positions of the devices so as to make electrical contact with various types of testers, thereby enabling performance test.

Another objective of the present invention is to enable electrical contact with terminals of a tester by precisely aligning devices even when the distances between the edges of the devices and the centers of the bumps disposed on the edges are not uniform.

Still another objective of the present invention is to reduce a cycle time for testing devices by symmetrically disposing device alignment parts and loading/unloading pickers on both sides of a tester.

In order to achieve the objectives, according to one aspect of the present invention, there is provided a test apparatus for devices having fine pitches, comprising a main body, a loading part provided on one side of the main body so that devices to be tested wait thereon, a loading picker provided on one side of the loading part so as to sequentially adsorb the devices to be tested, thereby putting the adsorbed devices on the upper surface of a vacuum chuck, the vacuum chuck having vacuum holes respectively formed at seating points of the devices which are adsorbed and moved by means of the loading picker and moving along a rail, a loading zone in which the devices to be tested are put on the vacuum chuck, a device alignment part, which is provided at the upper portion of the loading zone so as to move along X, Y and θ axes, checks the positions of the devices suctioned by the vacuum chuck, and informs a control unit of coordinate values, thereby aligning the devices, a test position where the devices suctioned by the vacuum chuck move along the rail in an aligned state and wait, a tester for testing the performance of the devices for a set time as the vacuum chuck positioned in the test position moves and comes into electrical contact with the bumps of the respective devices, an unloading zone in which the vacuum chuck with the devices completely tested by the tester is positioned, and an unloading picker, which is provided at one side of the unloading zone so as to adsorb the completely tested devices from the vacuum chuck, sorts the completely tested devices into good products and bad products, and unloads the tested devices as sorted on a tray of an unloading part.

The present invention has the following advantages over the prior art.

First, if devices to be tested are simply loaded on the loading part, the device aligning part automatically aligns the devices accurately even if the distances from the edges of the devices to the centers of the bumps placed on the edges are not uniform, so that the bumps of the devices come into electrical contact with the terminals of the tester. Therefore, it is possible to test the performance of the devices with a fine pitch.

Second, regardless of the type of a tester (overhead, horizontal, vertical types or the like), the performance of the devices moved to the test position can be tested through electrical contact between the bumps of the devices and the terminals of the tester.

Third, according to test conditions, the vacuum chuck is maintained at room temperature or the vacuum chuck is heated or cooled, so that the devices are loaded in a state, in which the vacuum chuck is expanded or contracted according to the expansion coefficient of the vacuum chuck, and thus it is possible to minimize the alignment tolerance.

Fourth, after the devices to be aligned are loaded on the vacuum chuck, the alignment status of the aligned devices is checked once more by means of the first alignment vision, thereby further maximizing the alignment reliability.

Fifth, in a state in which the vacuum chuck with the devices of which alignment is completed is moved to the tester side, the X and Y values of the vacuum chuck are checked by the second alignment vision and are informed to the control unit, so that the vacuum chuck posture correction means accurately corrects the posture of the vacuum chuck, thereby preventing poor contact.

Sixth, when the device alignment parts and the loading/unloading pickers are symmetrically arranged at both sides of the main body, it is possible to reduce the cycle time according to the device test.

DETAILED DESCRIPTION

Figure 1:
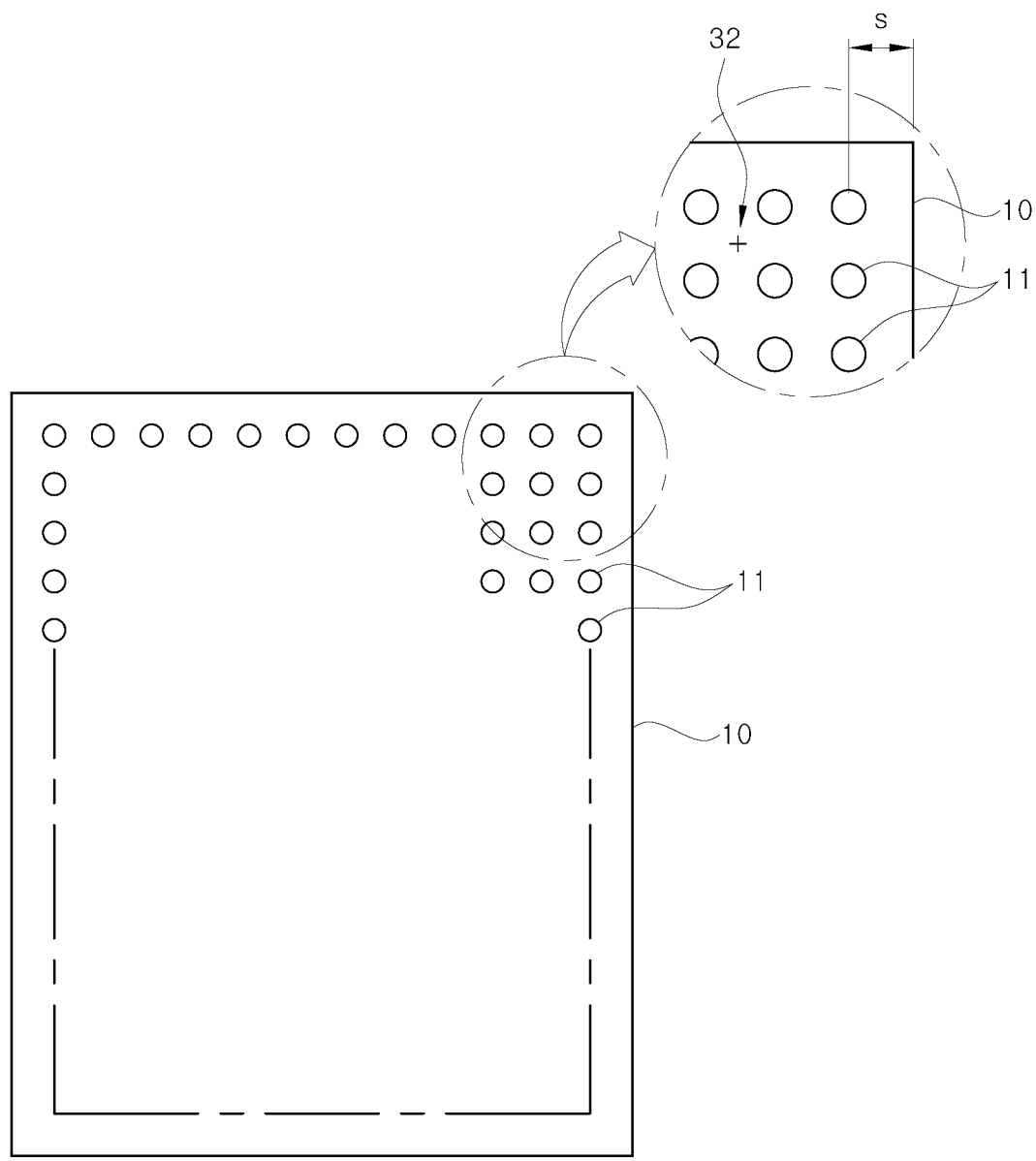
FIG. 1 is a bottom view showing the bumps of a general HBM.

Hereinafter, with reference to the accompanying drawings, embodiments of the present invention will be described in detail such that those of ordinary skill in the art can easily implement them. The present invention may be implemented in several different forms and is not limited to the embodiments described herein. It should be noted that the drawings are schematic and not drawn to scale. Relative dimensions and proportions of parts in the drawings are shown exaggerated or reduced in size for clarity and convenience in the drawings and any dimensions are illustrative only and not limiting. In addition, the same reference numerals are used to denote like features to the same structure, element, or part appearing in two or more drawings.

Figure 2:
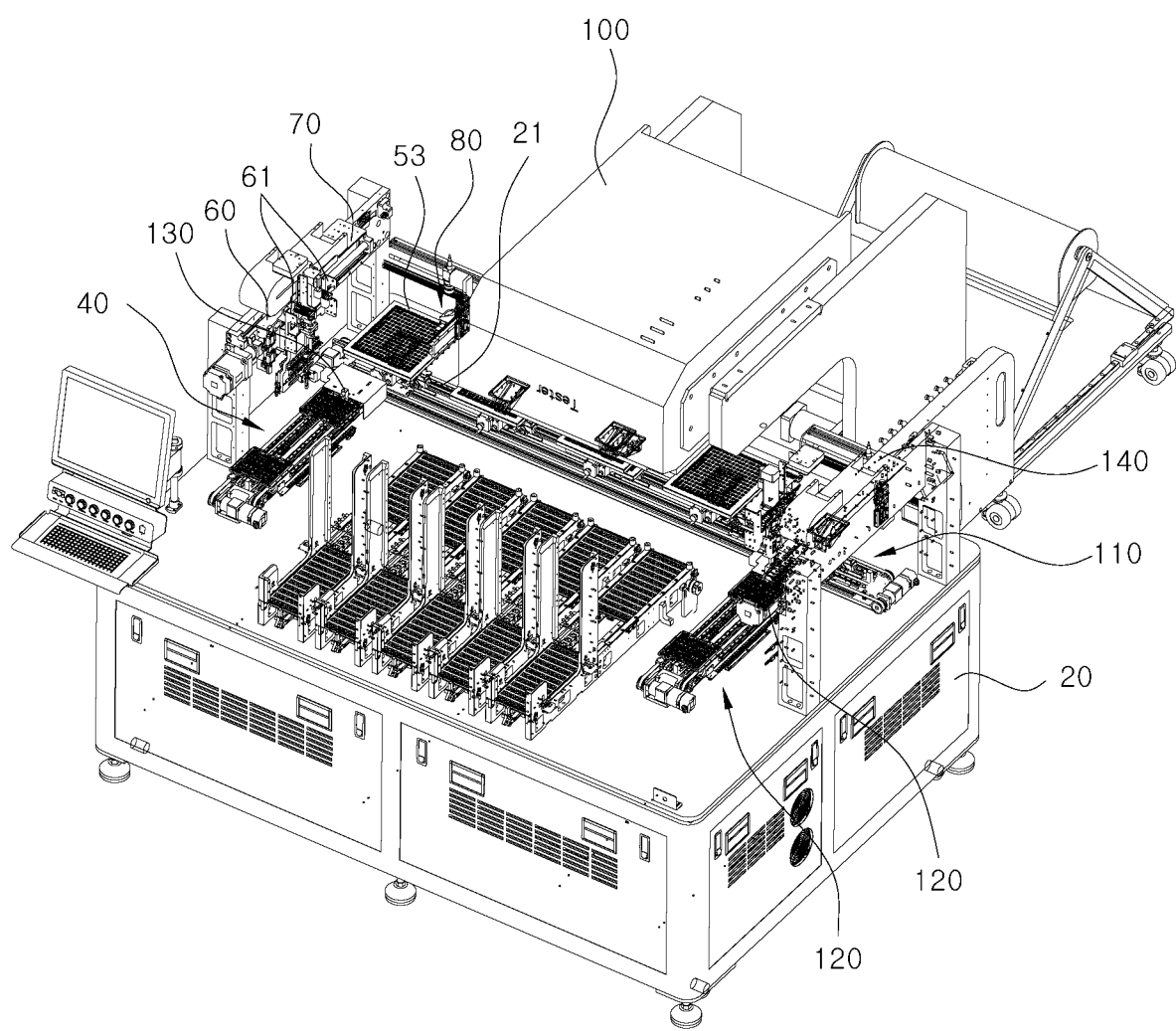
FIG. 2 is a perspective view showing an embodiment of the present invention.
Figure 3:
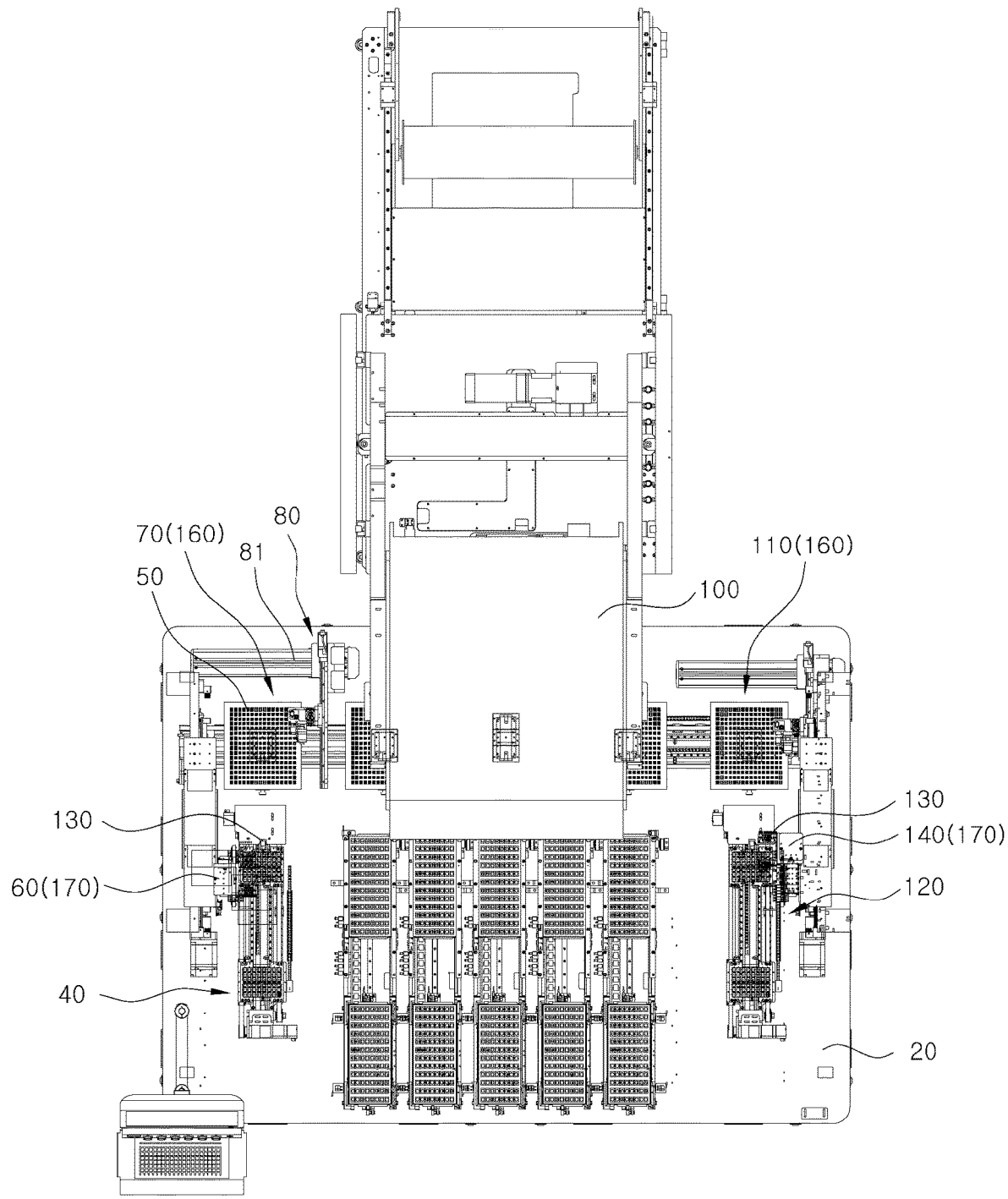
FIG. 3 is a top view of FIG. 2.

FIG. 2 is a perspective view showing an embodiment of the present invention and FIG. 3 is a top view of FIG. 2. Referring to FIG. 2 and FIG. 3, the present invention includes a main body 20, a loading part 40 provided on one side of the main body 20 so that devices 30 to be tested wait thereon, a loading picker 60 provided on one side of the loading part 40 so as to sequentially adsorb the devices 30 to be tested, thereby putting the adsorbed devices 30 on the upper surface of a vacuum chuck 50, the vacuum chuck 50, which has vacuum holes 51 respectively formed at seating points of the devices 30 adsorbed and moved by means of the loading picker 60, and which moves along a rail 21, a loading zone 70 in which the devices 30 to be tested are put on the vacuum chuck 50, a device alignment part 80, which is provided at the upper portion of the loading zone 70 so as to move along X, Y and θ axes, checks the positions of the devices 30 suctioned by the vacuum chuck 50, and informs a control unit of the coordinate values of the positions, thereby aligning the devices 30, a test position 90 where the devices 30 suctioned by the vacuum chuck 50 move along the rail 21 in an aligned state and wait, a tester 100 for testing the performance of the devices for a set time as the vacuum chuck 50 positioned in the test position 90 moves and brings the tester 100 into electrical contact with the bumps of the respective devices 30, an unloading zone 110 in which the vacuum chuck 50 with the devices 30 completely tested by the tester 100 is positioned, an unloading picker 140, which is provided at one side of the unloading zone 110 so as to adsorb the completely tested devices 30 from the vacuum chuck 50, sorts the completely tested devices 30 into good products and bad products, and unloads the tested devices 30 as sorted on a tray 130 of an unloading part 120, or the like.

Referring to FIG. 2 and FIG. 3 showing an embodiment of the present invention, the loading picker 60 is installed so as to move along X and Y axes 61 and the vacuum chuck 50 is installed so as to move along the rail 21, so that after the vacuum chuck 50 is placed in the loading zone 70, the loading picker 60 adsorbs the devices 30 positioned on the loading part 40 while moving along the X and Y axes 61 and then the loading picker 60 sequentially places the devices 30 onto the respective vacuum holes 51 of the vacuum chuck 50.

However, it could be understood that the loading picker 60 can sequentially load the devices 30 onto the respective vacuum holes 51 of the vacuum chuck 50 even when the loading picker 60 is installed to move along the Y-axis and the vacuum chuck 50 is installed to move along the X-axis by one step (a distance between the centers of two adjacent vacuum holes) as necessary.

Figure 4:
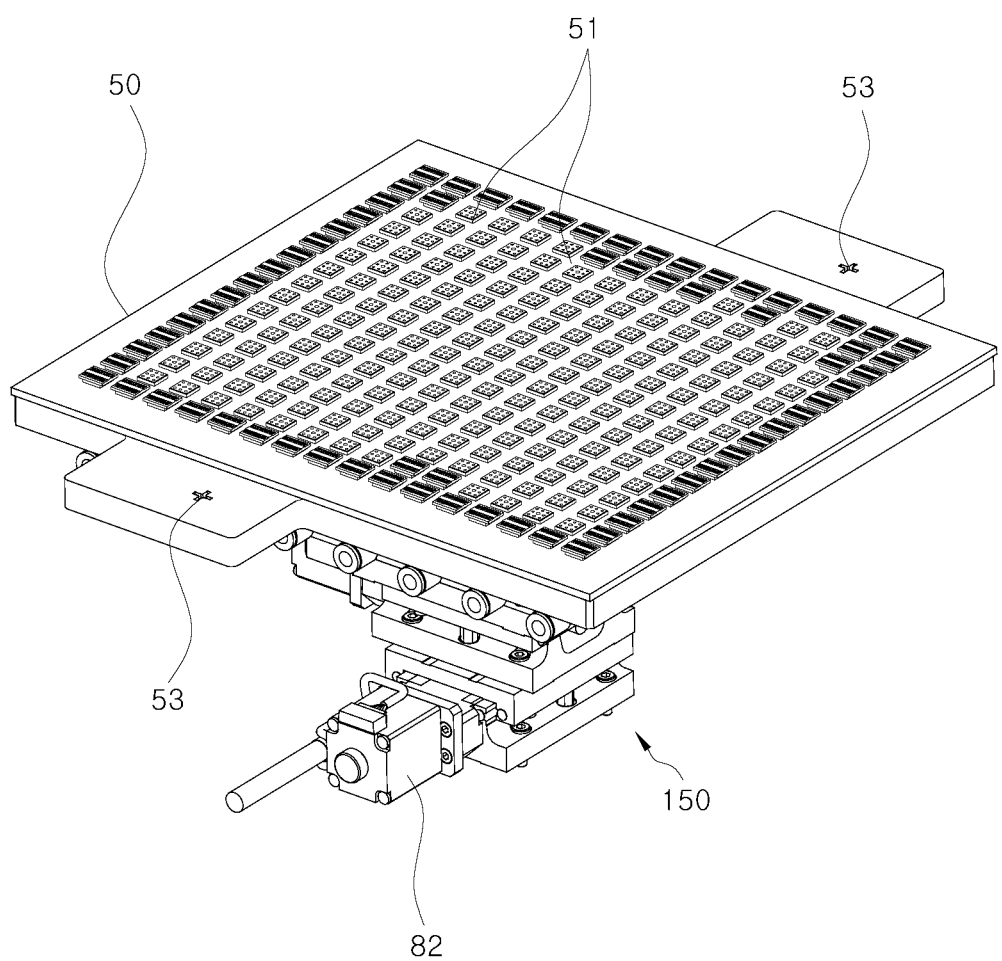
FIG. 4 is a perspective view showing the installation state of a vacuum chuck in the present invention.
Figure 5:
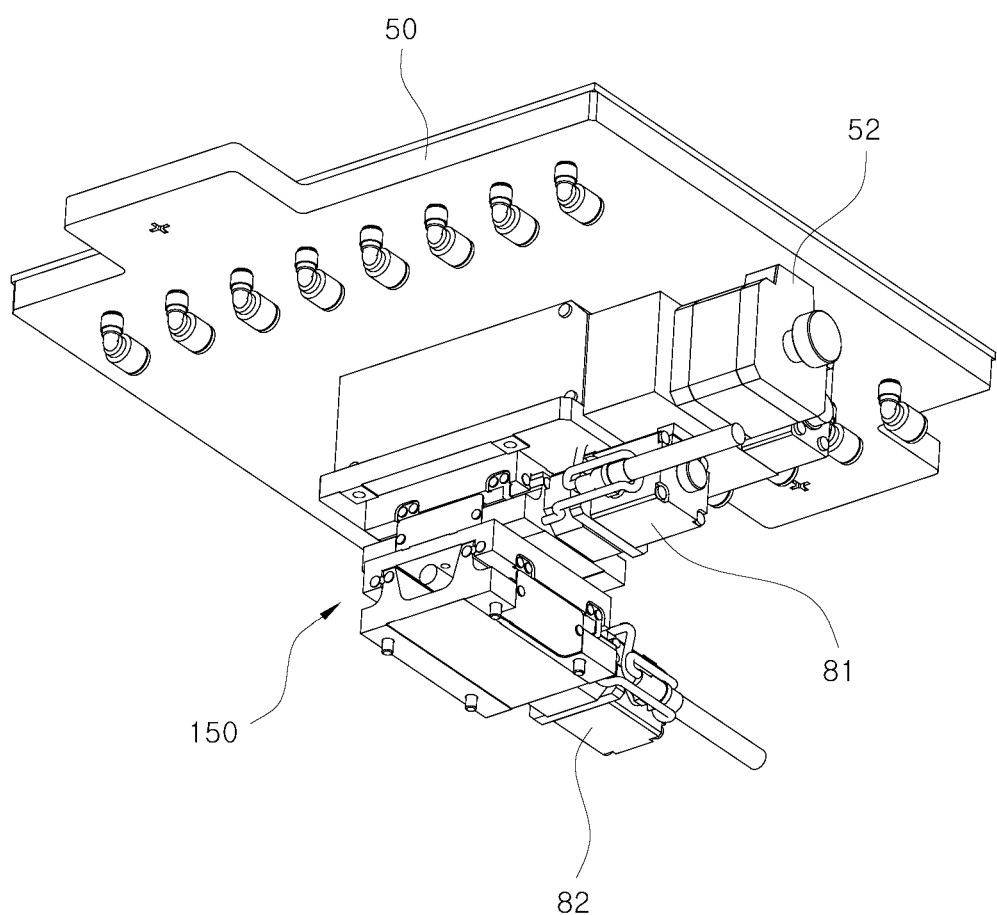
FIG. 5 is a bottom perspective view of FIG. 4.

FIG. 4 is a perspective view showing the installation state of a vacuum chuck in the present invention, and FIG. 5 is a bottom perspective view of FIG. 4. Referring to FIG. 4 and FIG. 5, the vacuum chuck 50 moving along the rail 21 has the plurality of vacuum holes 51, onto which the devices 30 are placed by means of the loading picker 60 and maintained in a suctioned state by vacuum pressure, and a Z-axis motor 52, which is installed under the vacuum chuck 50 so as to move the vacuum chuck 50 to the tester 100 side in the test position 90.

The vacuum holes 51 are applied with primary vacuum pressure (about 5-50 mmHg) so that the devices 30 moved by the loading picker 60 are prevented from moving before alignment.

Herein, if the vacuum pressure applied to the vacuum holes 51 is less than 5 mmHg, there is a fear that the position of the devices 30 may be changed due to vibration, etc., even if the alignment of the devices 30 is completed by the device alignment part 80. To the contrary, if the vacuum pressure applied to the vacuum holes 51 exceeds 50 mmHg, there is a fear that the vacuum pressure is too large to move the devices 30 to a desired position when performing alignment by correcting the positions of devices 30 with the device alignment part 80.

It is possible to continuously apply the vacuum pressure of about 5-50 mmHg to the vacuum holes 51, but it is more preferable to increase the pressure so that secondary vacuum pressure of about 50-100 mmHg is applied before moving the vacuum chuck 50 to the tester 100 side in a state where the alignment of the devices 30 is completed by the device alignment part 80.

This is to fundamentally solve the phenomenon that the position of the devices varies between the movement of the vacuum chuck 50 or when conducting a test by brings the bumps of the devices 30 into contact with the terminals of the tester 100.

The primary vacuum pressure to be applied to the vacuum holes 51 as described above is applied sequentially to the vacuum holes 51 before the devices 30 are placed, or flow paths may be formed so that the vacuum pressure is simultaneously applied to the vacuum holes divided into predetermined regions, for example, ten vacuum holes at a time.

In addition, a heater or a cooling pipe (not shown) is installed in the vacuum chuck 50 so as to maintain the vacuum chuck 50 at room temperature or to heat the vacuum chuck 50 to about 50 to 170° C. or to cool the vacuum chuck 50 to about 0 to −55° C. according to the test conditions of the devices 30 before loading the devices 30 to the upper surface of the vacuum chuck 50.

Assuming that the size of the vacuum chuck 50 is 300× 300 mm, even if the vacuum chuck 50 is made of a material with a minimum coefficient of expansion (for example, ceramics, etc.), the vacuum chuck 50 expands or contracts within a range of about 0.3 mm according to heating and cooling. Therefore, the temperature of the vacuum chuck 50 is adjusted according to the test conditions before the loading picker 60 loads the devices 30 onto the upper surface of the vacuum chuck 50, so that it is possible to reduce an error caused by the expansion or contraction of the vacuum chuck 50.

Figure 6:
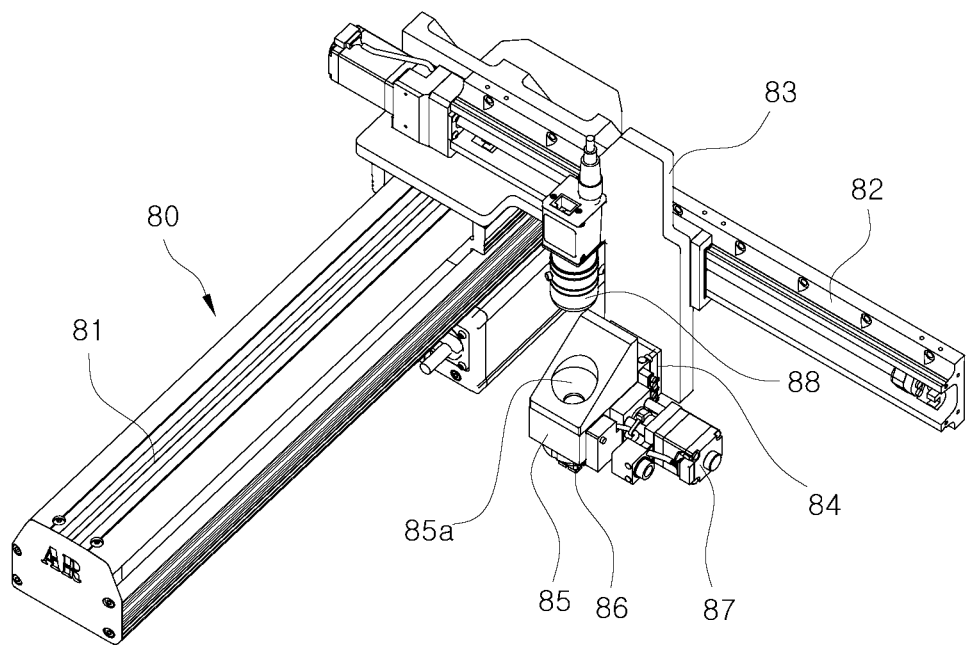
FIG. 6 is a perspective view showing a device alignment part in the present invention.
Figure 7:
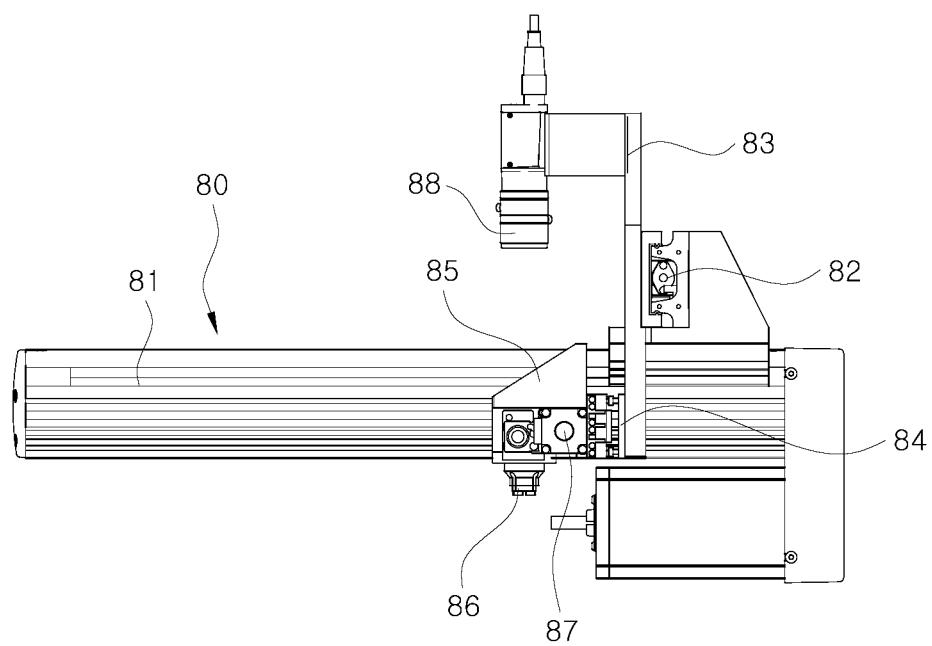
FIG. 7 is a side view of FIG. 6.

FIG. 6 is a perspective view showing the device alignment part in the present invention, and FIG. 7 is a side view of FIG. 6. Referring to FIG. 6 and FIG. 7, the device alignment part 80 includes an X-axis rail 81 installed on the main body 20, a Y-axis rail 82 installed on the X-axis rail 81 so as to move along the X-axis rail 82, a moving body 83 installed on the Y-axis rail 82, an alignment jig block 85, which is installed on a lifting block 84 of the moving body 83 and has a vertically penetrating through hole 85a formed therein, an alignment jig 86 installed at the lower portion of the alignment jig block 85 so as to correct the position of the device 30 suctioned by the vacuum chuck 50 by pushing the device 30, a θ-axis compensation motor 87 installed on the alignment jig block 85 so as to correct a θ-value of the alignment jig 86, and a first alignment vision 88 installed on the moving body 83 so as to check the positions of the devices 30 suctioned by the vacuum chuck 50 through the through hole 85a of the alignment jig block 85 and to inform the control unit of coordinate values of the positions, wherein if the first alignment vision 88 checks the positions of the devices 30 suctioned by the vacuum chuck 50 and informs the control unit (not shown) of the coordinate values of the devices 30, the alignment jig 86 descends according to the coordinate values of the devices 30 so as to move the devices 30 in the X, Y and θ directions, thereby aligning the devices 30.

Figure 8A:
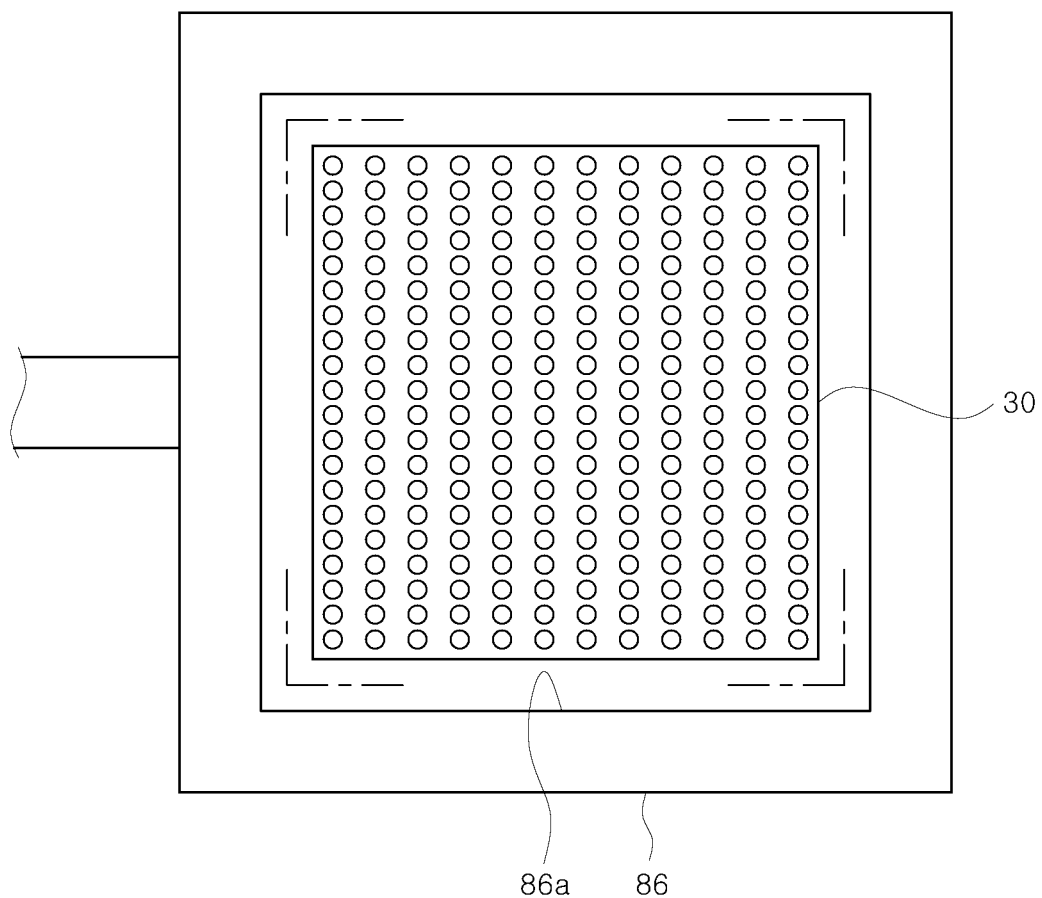
FIG. 8*a* is a plan view showing a state, in which an alignment jig surrounds a device in the present invention.
Figure 8B:
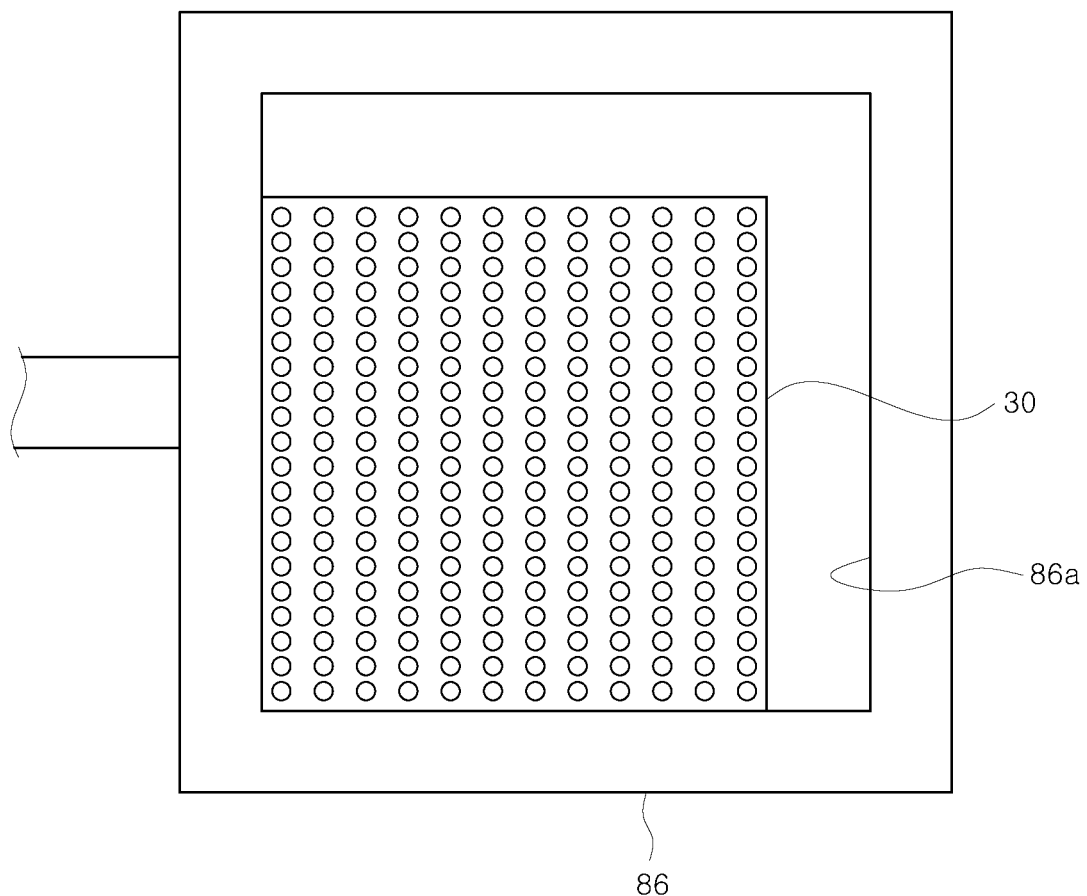
FIG. 8*b* is a view showing a state, in which two sides of the device are connected to the inner circumferential surface of the alignment jig so that the alignment jig pushes the device in the present invention.

The alignment jig 86 has an opening part 86a formed to be larger than the device 30, as shown in FIG. 8a, so that the device 30 is maintained as being accommodated in the opening part 86a of the alignment jig 86. Therefore, when the alignment jig 86 moves according to the coordinate values of the device 30, the device 30 is moved together with the alignment jig 86 while two surfaces of the device 30 are in contact with the inner surface of the opening part 86a and thus aligned by the alignment jig 86.

Figure 9A:
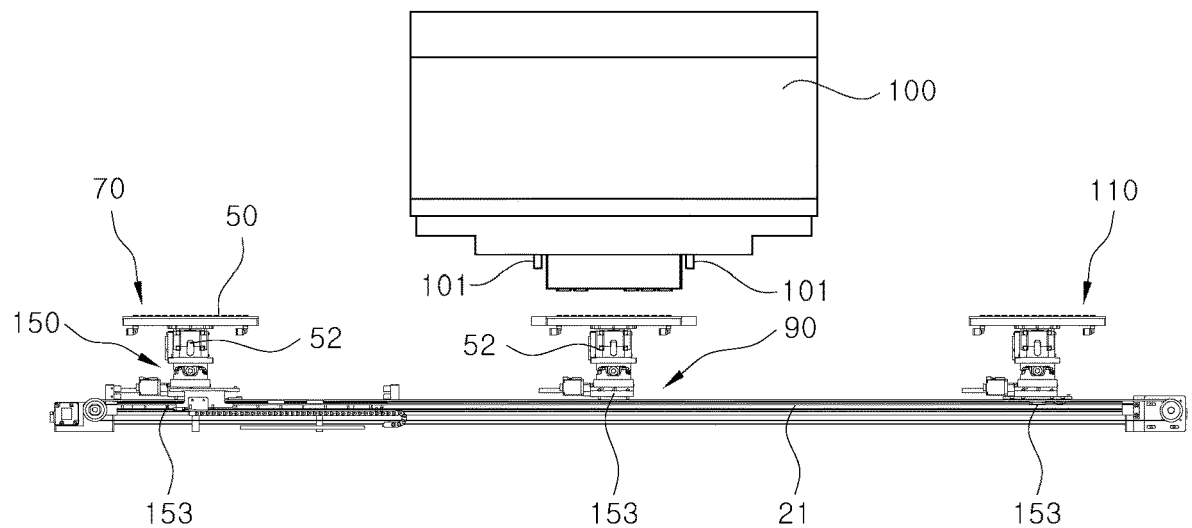
FIG. 9*a* and FIG. 9*b* are front views showing the vacuum chuck that moves along a rail.
Figure 11A:
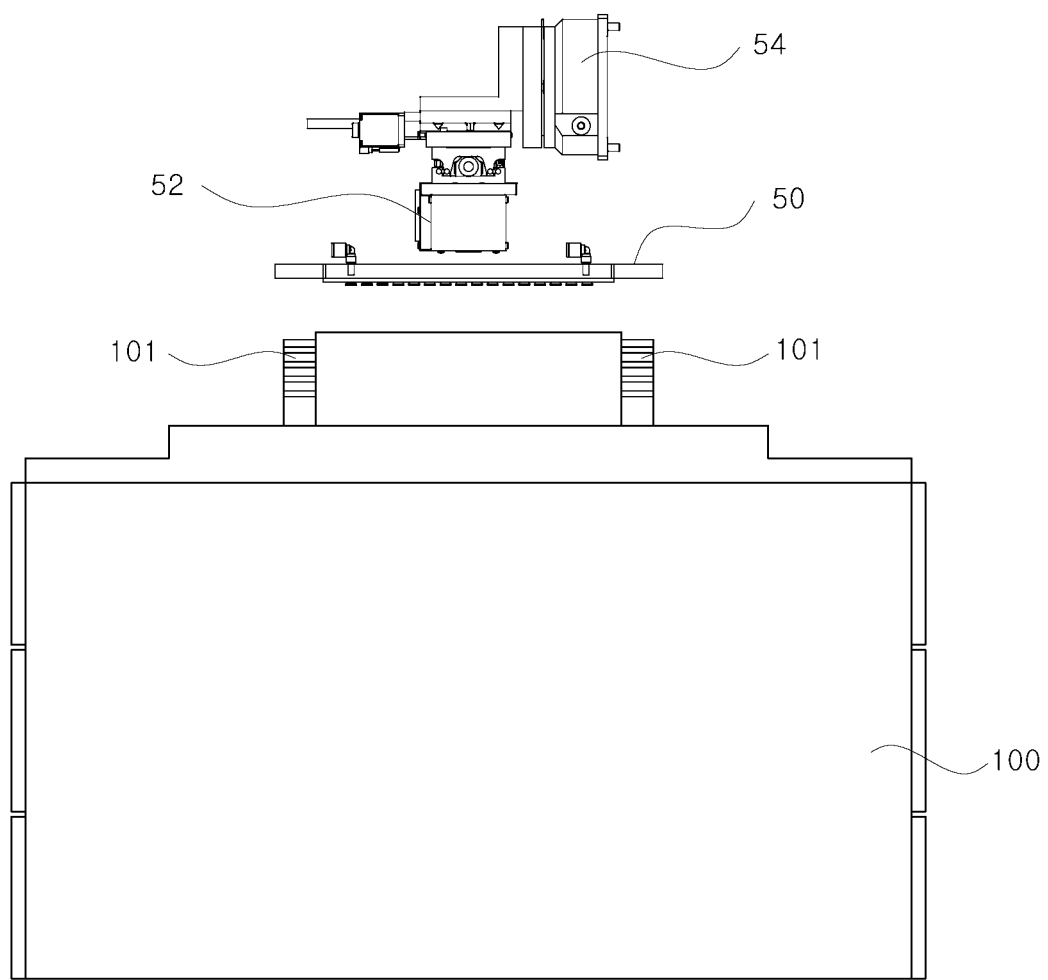
FIG. 11*a* and FIG. 11*b* are a front view and a side view respectively showing a horizontal type tester and a vertical type tester in the present invention.

In an embodiment of the present invention, a coordinate recognition mark 53 is displayed on the vacuum chuck 50 as shown in FIG. 4, a second alignment vision 101 that confirms the position of the coordinate recognition mark 53 is installed on the tester 100 as shown in FIG. 9a and FIG. 11a, and a vacuum chuck posture correction means 150 is provided at the lower portion of the vacuum chuck 50 as shown in FIG. 5.

This is because, when the vacuum chuck 50 is moved to the tester 100 side, there is a possibility that X and Y values may change due to the machining tolerance or assembly tolerance of parts.

Accordingly, before the vacuum chuck 50 moved to the test position 90 is moved to the tester 100 side, the second alignment visions 101 installed on both sides of the tester 100 as shown in FIG. 9a check the X and Y values of the coordinate recognition marks 53 of the vacuum chuck 50 and inform the control unit of the X and Y values, so that the vacuum chuck posture correction means 150 corrects the posture of the vacuum chuck 50.

If the vacuum chuck 50 is moved to the tester 100 side so as to bring the bumps of the devices 30 into contact with the terminals of the tester 100 in a state, in which the X and Y values of the vacuum chuck 50 are changed, there is a fatal defect that the bumps of the devices 30 do not come into contact with the terminals of the tester 100 even if the devices 30 are correctly aligned by the device alignment part 80.

That is, since the X and Y values of the vacuum chuck 50 are changed, some bumps come into contact with the terminals of the tester 100 and the remaining bumps do not come into contact with the terminals of the tester 100, so a fatal error of judging good devices 30 as defective may occur.

According to an embodiment of the present invention, as shown in FIG. 5, the vacuum chuck posture correction means 150 includes a Y-axis compensation motor 151 installed on the lower surface of the vacuum chuck 50 so as to compensate a Y-axis value and an X-axis compensation motor 152 installed on the lower surface of the Y-axis compensation motor 151 so as to compensate an X-axis value, wherein the X-axis compensation motor 152 is fixedly installed on a slider 153 that moves along the rail 21.

In the embodiment of the present invention, it has been illustrated that the Z-axis motor 52 is installed at the lower portion of the vacuum chuck 50 and the vacuum chuck posture correcting means 150 is installed at the lower portion thereof, but is not necessarily limited thereto. It is also possible that the vacuum chuck posture correction means 150 is installed at the lower portion of the vacuum chuck 50 and the Z-axis motor 52 is installed at the lower portion thereof.

Figure 11B:
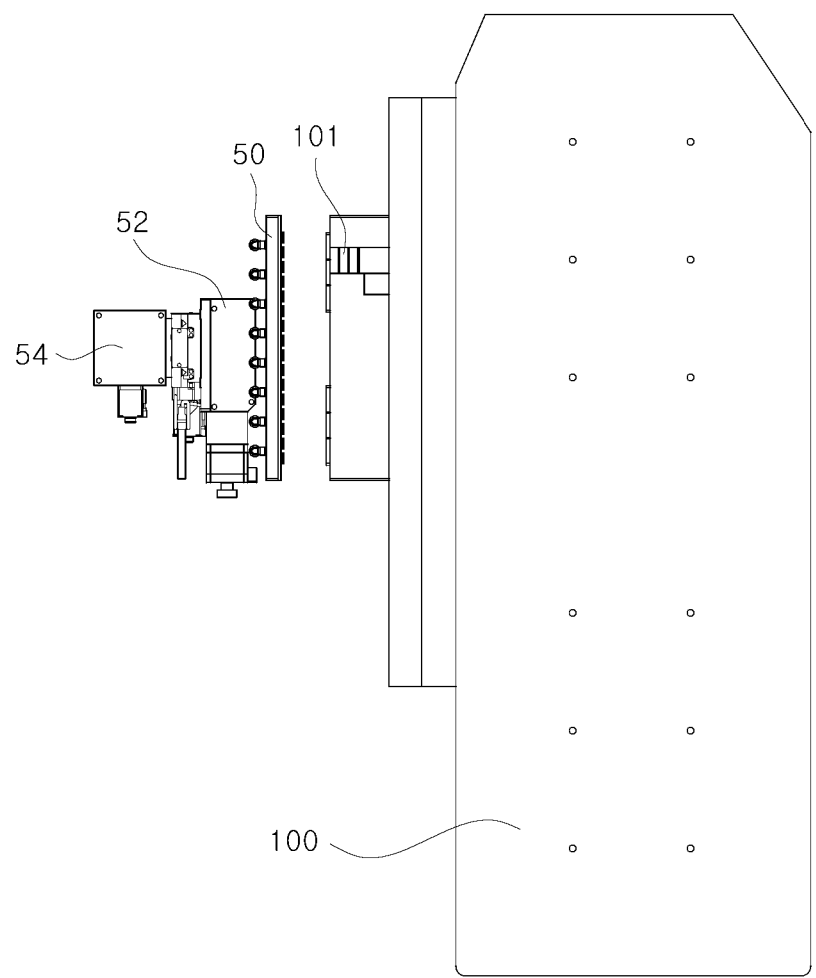

In addition, in the embodiment of the present invention, although the tester 100 is shown as an overhead type, it should be understood that the tester 100 may be applied in a horizontal type or a vertical type as shown in FIG. 11a and FIG. 11b.

That is, if the tester 100 is a horizontal type or a vertical type, a rotator 54 is provided so as to rotate the vacuum chuck 50 by 180° or 90° after the vacuum chuck 50 with the devices 30 aligned is moved directly below the tester 100.

In this case, the second alignment visions 101 are also installed on both sides of the tester 100 such that before the device 30 aligned on the vacuum chuck 50 is moved to the tester 100 side, the second alignment visions 101 check the posture of the vacuum chuck 50 rotated 180° or 90° by the rotator 54 so that the vacuum chuck posture correction means 150 corrects the posture of the vacuum chuck 50.

The operation of the present invention will be described as follows.

First, the vacuum chuck 50 is maintained at room temperature, or heated to about 50 to 170° C., or cooled to about 0 to −55° C. according to the test conditions of the devices 30, before loading the devices 30 on the upper surface of the vacuum chuck 50.

When the loading picker 60 adsorbs one device 30 from the tray 130 positioned in the loading part 40 and places the one device 30 on the vacuum hole 51 of the vacuum chuck 50 positioned in the loading zone 70 in a state, in which the vacuum chuck 50 is maintained at a temperature suitable for the test conditions of the devices 30 as described above, the device 30 is suctioned by a vacuum device (not shown) connected to the vacuum hole 51 at the primary vacuum pressure that permits fine movement of the device 30.

After the device 30 is loaded to any one of the vacuum holes formed in the vacuum chuck 50 and suctioned by the primary vacuum pressure that allows the fine movement of the device, the moving body 83 of the device alignment part 80 moves to the position of the device 30 suctioned by the vacuum chuck 50.

After the moving body 83 moves to the position of the device 30 suctioned by the vacuum chuck 50, the first alignment vision 88 installed on the moving body 83 checks the position of the device 30 through the through hole 85a formed in the alignment jig block 85 and the opening part 86a of the alignment jig 86 and informs the control unit (not shown) of the coordinate values thereof.

At this time, after the moving body 83 moves to the device 30 side to be corrected in position, the first alignment vision 88 recognizes a mark 32, which is displayed on the bottom surface of the device 30 as shown in FIG. 1, through the through hole 85a and the opening part 86a and informs the control unit of the coordinate values of the device 30 so that the control unit calculates the correction position of devices 30.

It is possible that the first alignment vision 88 installed on the upper portion of the moving body 83 recognizes the position of the device 30 and informs the control unit of the position of the devices 30, since the alignment jig 86 is formed with the opening part 86a so that the first alignment vision 88 can identify the position of the device 30 through the through hole 85a and the opening part 86a.

After the first alignment vision 88 installed on the moving body 83 informs the control unit of the coordinate values of the device 30, the moving body 83 moves along X- and Y-axis rails 81, 82 according to the coordinate values of the device 30 suctioned through the vacuum hole 51 and, at the same time, the alignment jig block 85 rotates as much as a set value by the operation of the θ-axis compensation motor 87 in a state where the lifting block is lowered, so the position of the alignment jig 86 is corrected.

The alignment jig block 85 on which the alignment jig 86 is installed is rotated by the set value according to the operation of the θ-axis compensation motor 87, since the θ-axis compensation motor 87 operates through the mutual engagement between a worm and a worm gear (not shown).

In this state, if the moving body 83 descends so that the device 30 is surrounded by the opening part 86a of the alignment jig 86, the moving body 83 moves along the X- and Y-axis rails 81, 82. Therefore, the control unit controls so that the device 30 is pushed by the set value by the alignment jig 86. Accordingly, the position of the device 30 is corrected and then the device 30 is correctly aligned.

When the alignment jig 86 is lowered toward the device 30 side by the moving body 83 so as to align the device 30 as described above, it is more preferable to correct the position of the device 30 while the alignment jig 86 is spaced apart from the upper surface of the vacuum chuck 50.

This is to prevent in advance the generation of particles due to friction when the alignment jig 86 aligns the position of the device 30 while moving in connection with the upper surface of the vacuum chuck 50.

After the alignment is completed by correcting the position of the device 30 by pushing the device 30 adsorbed to the vacuum chuck 50 by the alignment jig 86 in the same manner as described above, the first alignment vision 88 checks the position of the aligned device 30 again through the through hole 85a of the alignment jig block 85 and the opening part 86a of the alignment jig 86 before the moving body 83 returns to its initial position and informs the control unit of the position of the aligned device 30, wherein if the device 30 is correctly alignment, the inner surface of the opening part 86a of the alignment jig 86 is spaced apart from the device 30 and then the moving body 83 ascends and returns to the initial position, and if the device 30 is not correctly alignment, the realignment operation of the device 30 is performed through the above-described operation.

Since the operation as described above is performed in the same manner for all the devices 30 by adsorbing and placing the devices 30 onto the respective vacuum holes 51 by means of the loading picker 60 so that the devices are suctioned through the vacuum holes 51, the alignment of the devices 30 suctioned to the vacuum chuck 50 becomes possible.

After aligning the devices 30 by correcting the positions of the devices 30 suctioned through all the vacuum holes 51 of the vacuum chuck 50 in the above operation, it is more preferable to suction the devices with the secondary vacuum pressure (about 50-100 mmHg) so that the positions of the devices 30 are not changed due to vibration or the like when moving the vacuum chuck 50 to the tester 100 side.

After completing alignment by correcting the positions of the plurality of devices 30 loaded onto the vacuum holes 51 of the vacuum chuck 50 as described above, the vacuum chuck 50 with the plurality of devices 30 suctioned thereto moves along the rail 21 to the test position 90 which is the contact point with respect to the tester 100, as shown in FIG. 9a.

As the vacuum chuck 50 moves along the rail 21 to the test position 90 which is the contact point with respect to the tester 100, the second alignment visions 101 installed on both sides of the tester 100 checks the coordinate recognition marks 53 displayed on both sides of the vacuum chuck 50 so as to determine the posture of the vacuum chuck 50.

Accordingly, even if the position of the vacuum chuck 50 is not correct due to a machining tolerance, an assembly tolerance or the like when the vacuum chuck 50 is moved to the test position 90 which is directly below the tester 100, the posture of the vacuum chuck 50 can be adjusted by the vacuum chuck posture correction means 150.

That is, when the second alignment visions 101 recognize the coordinate recognition marks 53 displayed on the vacuum chuck 50 and inform the control unit of the recognized positions of the coordinate recognition marks 53, the control unit calculates the X and Y values according to the positions of the coordinate recognition marks 53, wherein if the calculated X and Y values do not match set values, the posture of the vacuum chuck 50 is corrected by driving the X- and Y-axis compensation motors 151, 152, as shown in FIG. 4 and FIG. 5.

If the vacuum chuck 50 is moved to the tester 100 side so as to bring the bumps of the devices 30 into contact with the terminals of the tester 100 in a state, in which the X and Y values are changed due to the machining tolerance and assembly tolerance of parts, there is a fatal defect that the bumps of the devices 30 do not come into contact with the terminals of the tester 100 even if the devices 30 are correctly aligned by the device alignment part 80.

That is, since the X and Y values of the vacuum chuck 50 are changed, some bumps come into contact with the terminals of the tester 100 and the remaining bumps do not come into contact with the terminals of the tester 100, so a fatal error of judging good devices 30 as defective may occur.

Figure 9B:
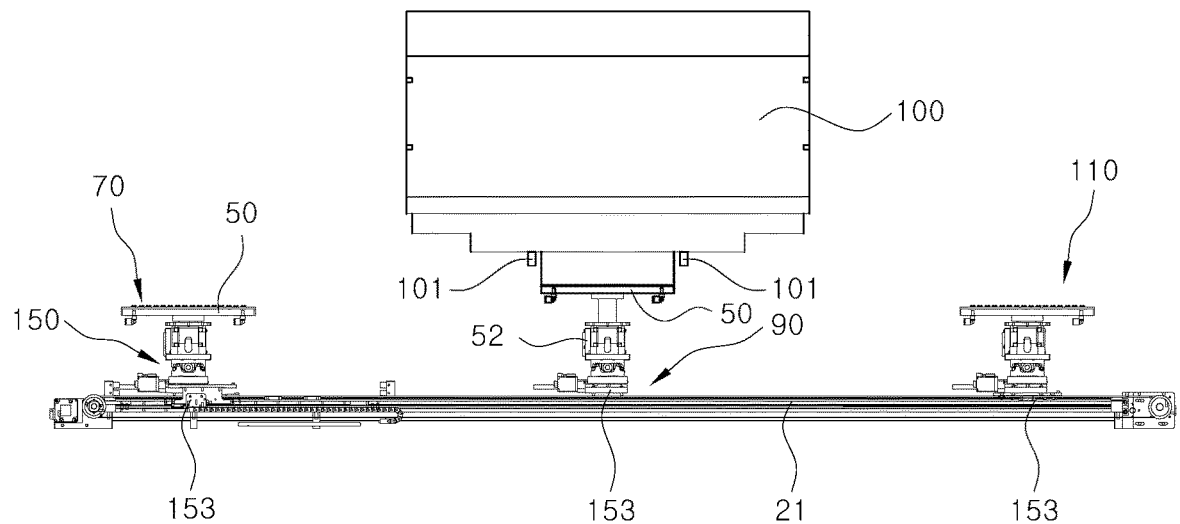
Figure 10:
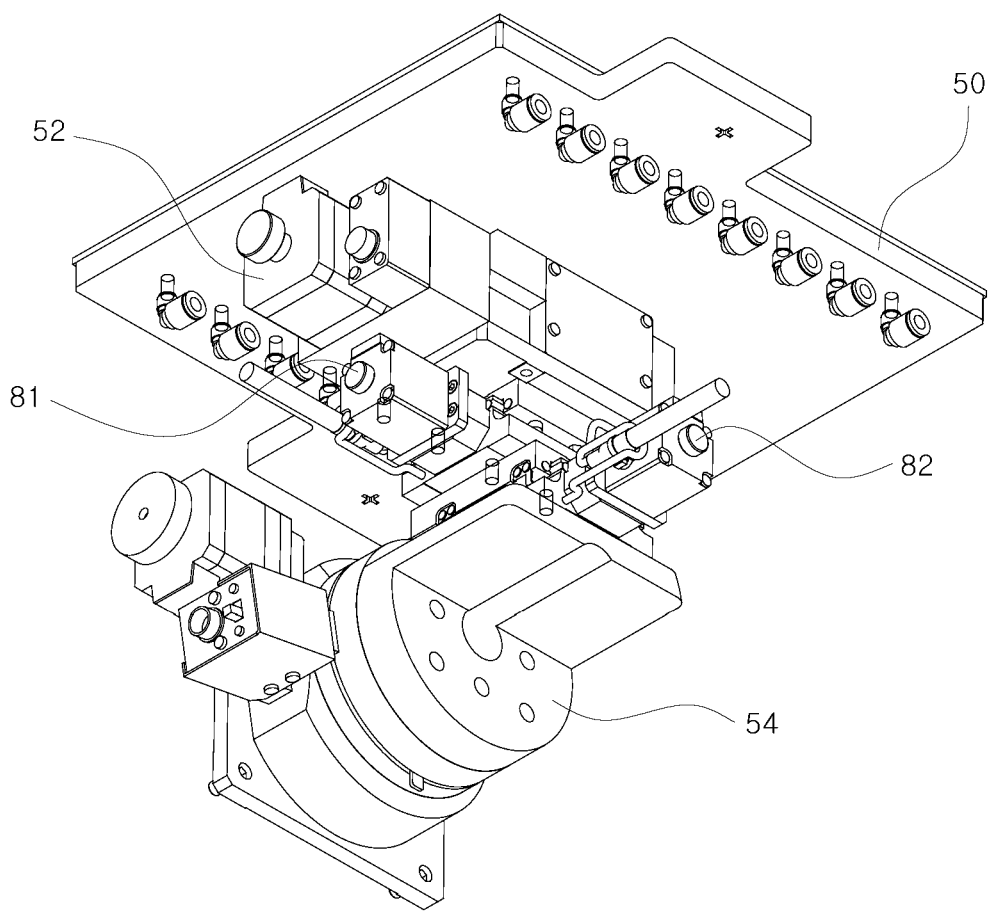
FIG. 10 is a bottom perspective view of the vacuum chuck provided with a rotator in the present invention.

Therefore, if the Z-axis motor 52 installed under the vacuum chuck 50 is driven in a state in which the posture of the vacuum chuck 50 is corrected by the vacuum chuck posture correction means 150, the vacuum chuck 50 rises to the tester 100 side, as shown in FIG. 9b, so that the bumps of the devices 30 suctioned by the vacuum chuck 50 come into contact with the terminals of the tester 100 and the devices 30 are tested for a set time.

After testing the performance of the devices 30 suctioned by the vacuum chuck 50, the vacuum chuck 50 descends and then moves along the rail 21 to the unloading zone 110, that is, to the right side of the drawing. Therefore, the vacuum pressure acting on the vacuum chuck 50 is released and at the same time the unloading picker 140 adsorbs the devices 30 sequentially, sorts the devices 30 into good and bad products according to the test results, and places the devices 30 as sorted on the tray positioned in the unloading part 120, wherein the good products are shipped out and the defective products are retested or discarded.

However, if the tester 100 is a horizontal type as shown in FIG. 11a rather than the overhead type, the rotator 54 rotates the vacuum chuck 50 by 180° in the state in which the vacuum chuck 50 reaches the test position 90. Then the second alignment visions 101 installed on both sides of the tester 100 recognize the coordinate recognition marks 53 and inform the control unit of the recognized positions of the coordinate recognition marks 53. Therefore, the posture of the vacuum chuck 50 that is rotated by the rotator 54 is corrected and then the Z-axis motor 52 moves the vacuum chuck 50 to the tester 100 side, thereby enabling the test of the devices 30.

Meanwhile, if the tester 100 is a vertical type as shown in FIG. 11b, the rotator 54 rotates the vacuum chuck 50 by 90° in the state in which the vacuum chuck 50 reaches the test position 90. Then the second alignment visions 101 installed on both sides of the tester 100 recognize the coordinate recognition marks 53 and inform the control unit of the recognized positions of the coordinate recognition marks 53. Therefore, the posture of the vacuum chuck 50 that is rotated by the rotator 54 is corrected and then the Z-axis motor 52 moves the vacuum chuck 50 to the tester 100 side, thereby enabling the test of the devices 30.

It has been described hereinabove that the loading zone 70 is arranged at one side of the rail 21 (left in the drawings) while the unloading zone 110 is arranged at the other side (right in the drawings), and the loading zone 70 includes the loading picker 60 and the device alignment part 80 while the unloading zone 110 includes the unloading picker 140, wherein the device alignment part 80 aligns the positions of the devices 30 seated on the vacuum chuck 50, the vacuum chuck 50 is moved along the rail 21 to the lower portion of the tester 100 so that the electrical characteristics of the devices 30 are tested for a set time, and then the vacuum chuck 50 reaches the unloading zone 110 so that the unloading picker 140 sorts the tested devices 30 into good and defective products according to the test results and unloads the devices 30 as sorted into the empty tray of the unloading part 120.

In the above configuration, it takes a lot of time to check the coordinate values of the devices 30 in the state, in which the devices 30 are placed on the upper surface of the vacuum chuck 50 by the loading picker 60 and suctioned thereto, and then align the devices 30 by the device alignment part 80. To the contrary, it takes a short time to unload the test-completed devices by the unloading picker 140. Therefore, the utilization rate of expensive equipment decreases.

Therefore, in order to maximize the utilization rate of expensive equipment, it is more preferable to symmetrically arrange device alignment parts 80 and loading/unloading pickers 160 for performing loading and unloading of the devices, respectively, on both sides of the main body 20 so that the loading zone 70 and the unloading zone 110 respectively have the functions of a loading/unloading zone 170 at the same time.

That is, the loading/unloading zones 170 having the functions of both the loading zone 70 and the unloading zone 110 at the same time are provided on both sides of the tester 100 disposed in the center of the main body 20 so as to load or unload the devices 30 to the vacuum chuck 50, the loading/unloading pickers 160 for adsorbing the devices 30 on the loading part 40 so as to load the devices 30 onto the upper surface of the vacuum chuck 50 or adsorbing the test-completed devices 30 from the vacuum chuck 50 so as to unload the test-completed devices 30 onto the unloading part 120 are installed in the upper portions of the respective loading/unloading zones 170, and the device alignment parts 80, which are movable along the X, Y and θ axes, check the positions of the devices 30 suctioned by the vacuum chuck 50, inform the control unit (not shown) of the coordinate values, and thus align the devices 30, are installed in the upper portions of the respective loading/unloading zones 170.

Therefore, in the loading/unloading zone 170 at one side (the left side of the drawings), one of the loading/unloading pickers 160 adsorbs and places the devices 30 on the vacuum chuck 50 positioned in the loading/unloading zone 170 and then one of the device alignment parts 80 aligns the positions of the devices 30. Then the vacuum chuck 50 moves along the rail 21 to a position directly below the tester 100 so as to conduct the test. Meanwhile, in the loading/unloading zone 170 at the other side (the right side of the drawings), the other loading/unloading picker 160 adsorbs and places the devices 30 on the upper surface of the vacuum chuck 50 positioned in the loading/unloading zone 170 and then the other device alignment part 80 aligns the positions of the devices 30.

As described above, while sequentially placing and aligning the devices 30 on the upper surface of the vacuum chuck 50 positioned in the loading/unloading zone 170 at the other side, the vacuum chuck 50 initially moved to the tester 100 side and having the test-completed devices is moved to the loading/unloading zone 170 positioned in the left side of the drawings. After that, the devices are unloaded by the loading/unloading picker 160 according the test results and at the same time the vacuum chuck 50 positioned in the right side of the drawings is moved to the tester 100 side so as to carry out the test. Therefore, the utilization rate of expensive equipment can be maximized.

Although embodiments of the present invention have been described with reference to the accompanying drawings, those of ordinary skill in the art to which the present invention belongs can understand that the present invention may be implemented in other specific forms without changing the technical spirit or essential features.

Therefore, the embodiments described hereinabove are to be understood as illustrative and not restrictive in all respects, the scope of the present invention described in the above detailed description is indicated by the following claims, and all changes or modifications derived from the meaning and scope of the claims and their equivalents should be construed as being included in the scope of the present invention.

BRIEF EXPLANATION OF REFERENCE SYMBOLS

| 20: | main body | 21: | rail |
|---|---|---|---|
| 30: | devices | 32: | mark |
| 40: | loading part | 50: | vacuum chuck |
| 51: | vacuum holes | 52: | Z-axis motor |
| 53: | coordinate recognition mark | 54: | rotator |
| 60: | loading picker | 61: | X/Y axes |
| 70: | loading zone | 80: | device alignment part |
| 81: | X-axis rail | 82: | Y-axis rail |
| 83: | moving body | 85: | alignment jig block |
| 85a: | through hole | 86: | alignment jig |
| 86a: | opening part | 87: | θ-axis compensation motor |
| 88: | first alignment vision | | |
| 100: | tester | 90: | test position |
| 110: | alignment zone | 101: | second alignment vision |
| 140: | unloading picker | | |
| 150: | vacuum chuck posture correction means | 120: | unloading part |
| 151: | Y-axis compensation motor | | |
| 152: | X-axis compensation motor | | |

What is claimed is:

1. A test apparatus for devices having fine pitches, comprising:
a main body;
a loading part provided on one side of the main body so that devices to be tested wait thereon;
a loading picker provided on one side of the loading part so as to sequentially adsorb the devices to be tested, thereby placing the devices adsorbed on an upper surface of a vacuum chuck;
the vacuum chuck, which has vacuum holes respectively formed at seating points of the devices adsorbed and moved by means of the loading picker, and which moves along a rail;
a loading zone in which the devices to be tested are put on the vacuum chuck;
a device alignment part, which is provided at an upper portion of the loading zone so as to move along X, Y and θ axes, checks positions of the devices suctioned by the vacuum chuck, and aligns the devices based on coordinate values of the devices;
a test position where the devices suctioned by the vacuum chuck move along the rail in an aligned state and wait;
a tester for testing performance of the devices for a set time as the vacuum chuck positioned in the test position moves and brings the tester into electrical contact with bumps of respective devices;
an unloading zone in which the vacuum chuck with the devices tested by the tester is positioned; and
an unloading picker, which is provided at one side of the unloading zone so as to adsorb the devices tested from the vacuum chuck, sorts the devices tested into good products and bad products, and unloads the devices tested as sorted on a tray of an unloading part.

2. The test apparatus for devices having fine pitches according to claim 1, wherein the device alignment part includes:
an X-axis rail installed on the main body;
a Y-axis rail installed on the X-axis rail so as to move along the X-axis rail;
a moving body installed on the Y-axis rail;
an alignment jig block, which is installed on a lifting block of the moving body and has a vertically penetrating through hole formed therein;
an alignment jig installed at a lower portion of the alignment jig block so as to correct the positions of the devices suctioned by the vacuum chuck by pushing the devices;
a θ-axis compensation motor installed on the alignment jig block so as to correct a θ-value of the alignment jig; and
a first alignment vision installed on the moving body so as to check the positions of the devices suctioned by the vacuum chuck through the through hole of the alignment jig block,
wherein if the first alignment vision checks the positions of the devices suctioned by the vacuum chuck, the alignment jig descends according to the coordinate values of the devices so as to move the devices in the X, Y and θ directions, thereby aligning the devices.

3. The test apparatus for devices having fine pitches according to claim 1, wherein a Z-axis motor that raises the vacuum chuck toward the tester in the test position is installed at a lower portion of the vacuum chuck and the tester is installed above the vacuum chuck, so that as the vacuum chuck reaches the test position, the Z-axis motor raises the vacuum chuck and enables the devices suctioned through the vacuum holes to come into electrical contact with terminals of the tester.

4. The test apparatus for devices having fine pitches of claim 3, wherein a coordinate recognition mark is displayed on the vacuum chuck, a second alignment vision that confirms a position of the coordinate recognition mark is installed on the tester, and a vacuum chuck posture correction means is provided at the lower portion of the vacuum chuck, so that before the vacuum chuck is moved to the tester in the test position, the second alignment vision checks X and Y values of the coordinate recognition mark of the vacuum chuck such that the vacuum chuck posture correction means corrects a posture of the vacuum chuck based on the X and Y values.

5. The test apparatus for devices having fine pitches according to claim 4, wherein the vacuum chuck posture correction means includes a Y-axis compensation motor installed on a lower surface of the vacuum chuck so as to compensate a Y-axis value and an X-axis compensation motor installed on a lower surface of the Y-axis compensation motor so as to compensate an X-axis value, and the X-axis compensation motor is fixedly installed on a slider that moves along the rail.

6. The test apparatus for devices having fine pitches according to claim 1, wherein a rotator that rotates the vacuum chuck 180° and the Z-axis motor that raises the vacuum chuck toward the tester in the test position are installed at a lower portion of the vacuum chuck and the tester is installed below the test position, so that as the vacuum chuck reaches the test position, the Z-axis motor moves the vacuum chuck toward the tester in a state, in which the vacuum chuck is rotated 180° by the rotator, and enables the devices suctioned through the vacuum holes to come into electrical contact with terminals of the tester.

7. The test apparatus for devices having fine pitches of claim 6, wherein a coordinate recognition mark is displayed on the vacuum chuck, a second alignment vision that confirms a position of the coordinate recognition mark is installed on the tester, and a vacuum chuck posture correction means is provided at the lower portion of the vacuum chuck, so that before the vacuum chuck is moved to the tester in the test position, the second alignment vision checks X and Y values of the coordinate recognition mark of the vacuum chuck such that the vacuum chuck posture correction means corrects a posture of the vacuum chuck based on the X and Y values.

8. The test apparatus for devices having fine pitches according to claim 1, wherein a rotator that rotates the vacuum chuck 90° and the Z-axis motor that raises the vacuum chuck toward the tester in the test position are installed at a lower portion of the vacuum chuck and the tester is installed below the test position, so that as the vacuum chuck reaches the test position, the Z-axis motor moves the vacuum chuck toward the tester in a state, in which the vacuum chuck is rotated 90° by the rotator, and enables the devices suctioned through the vacuum holes to come into electrical contact with terminals of the tester.

9. The test apparatus for devices having fine pitches of claim 8, wherein a coordinate recognition mark is displayed on the vacuum chuck, a second alignment vision that confirms a position of the coordinate recognition mark is installed on the tester, and a vacuum chuck posture correction means is provided at the lower portion of the vacuum chuck, so that before the vacuum chuck is moved to the tester in the test position, the second alignment vision checks X and Y values of the coordinate recognition mark of the vacuum chuck such that the vacuum chuck posture correction means corrects a posture of the vacuum chuck based on the X and Y values.

* * * * *